Feb. 9, 1971 D. W. HALL II 3,562,669

FEEDBACK TYPE OSCILLATOR WITH INPUT STABILIZING MEANS

Filed July 1, 1968

INVENTOR
David W. Hall, II

BY H. Christoffersen

ATTORNEY

United States Patent Office 3,562,669

Patented Feb. 9, 1971

3,562,669

FEEDBACK TYPE OSCILLATOR WITH INPUT STABILIZING MEANS

David W. Hall II, Palm Beach, Fla., assignor to RCA Corporation, a corporation of Delaware Filed July 1, 1968, Ser. No. 741,478
Int. Cl. H03b 5/26
U.S. Cl. 331—110 6 Claims

ABSTRACT OF THE DISCLOSURE

A feedback type oscillator has an amplifier with negligible A-C input impedance and is provided with an external input impedance to make the frequency of oscillation predictable.

BACKGROUND OF THE INVENTION

This invention relates to feedback type oscillators including Wien Bridge and phase shift oscillators. Oscillators require amplifiers to restore the energy losses in the circuit elements, and the input impedance of the amplifier usually causes the frequency of oscillation to vary from the theoretical frequency for which the oscillator was designed. One technique for minimizing the difference between the design and the actual frequencies is to assume an infinite input impedance for the amplifier and use an amplifier with so high an input impedance as it is possible to attain or at least high enough that its loading effect on the feedback circuit does not cause a difference greater than a predetermined value.

Another technique to minimize the difference between the design and actual frequencies is to determine the value of the input impedance of the amplifier and use the value in the design equations to correct for its effect. However, the input impedance of the amplifier varies from one circuit to another although all are manufactured using similar elements and components. The variation is the result of differences in the parameters of the elements used in the amplifiers. This is especially true in bipolar transistor circuits. The result is that oscillators manufactured "identically" will usually differ somewhat in frequency from one another.

An object of this inveniton is to provide a feedback oscillator circuit, the frequency of which is independent, or nearly so, of the input impedance of its amplifier.

Another object of this invention is to provide an oscillator circuit that can be economically manufactured in quantity so the frequency of all of them will be substantially the same.

Further objects and advantages will become clear after reading the detailed description of the invention.

BRIEF SUMMARY OF THE INVENTION

An oscillator with a frequency-determining feedback network uses an amplifier with negligible A-C input impedance and has an external A-C impedance provided between the feedback network and the amplifier input.

DETAILED DESCRIPTION

Figure 1:
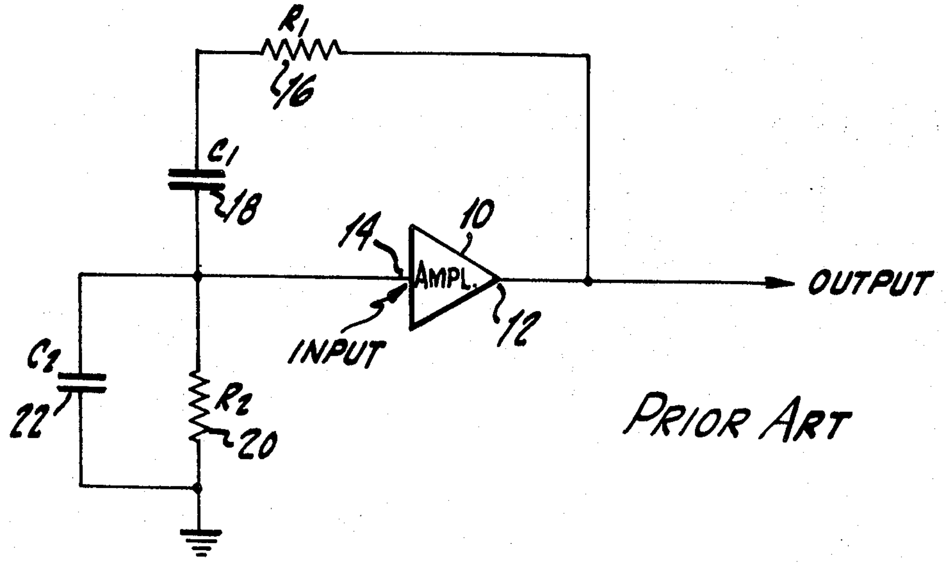
FIG. 1 is a schematic of a prior art R-C feedback type oscillator commonly called a Wien Bridge oscillator.

FIG. 1 is an illustration of a general oscillator circuit of the type called variously Wien Bridge, R-C coupled, or R-C Feedback. The amplifier 10 is non-inverting so that the signal coupled from the output 12 to the input 14 is positive, or regenerative. Theoretically, the frequency of oscillation is determined solely by the values of the resistors 16 and 20 and capacitors 18 and 22. An analysis of the circuit can show that the theoretical frequency of oscillation is given by the formula $$f=(R_1R_2C_1C_2)^{-1/2}/(2\pi) \qquad (1)$$

where $f$=frequency, in Hertz;
$R_1$=resistance of the resistor 16, in ohms;
$R_2$=resistance of the resistor 20, in ohms;
$C_1$=capacitance of the capacitor 18, in farads; and
$C_2$=capacitance of the capacitor 22, in farads.

The calculation of the frequency of the oscillator by means of Equation 1, above, is based on the assumption that the amplifier 10 is ideal, i.e., it assumes inter alia that the A-C impedance of the input 14 to the reference point, shown as ground, is infinite or nearly so with respect to the other circuit parameters. Practically, the high input impedance desirable is difficult to realize in most circuits, especially those employing bipolar transistors, without adding circuit elements or employing complex design techniques or both.

The finite input impedance acts as if it were connected in parallel with the resistor 20 connected between the input 14 of the amplifier 10 and the reference point. The frequency of oscillation is, therefore, more accurately given by $$f=(R_1R_2R_IC_1C_2/(R_I+R_2))^{-1/2}(2\pi) \qquad (2)$$

where $f$=frequency, in Hertz;
$R_1$=resistance of the resistor 16, in ohms;
$R_2$=resistance of the resistor 20, in ohms;
$R_I$=resistance of the input impedance of the amplifier, in ohms;
$C_1$=capacitance of the capacitor 18, in farads; and
$C_2$=capacitance of the capacitor 22, in farads.

Equation 2 reveals that the frequency of a practical or realizable amplifier is the theoretical frequency multiplied by a variation factor of $$v=(1+R_2/R_I)^{1/2} \qquad (3)$$

where $v$=variation factor, dimensionless; and
$R_2$, $R_I$ as in Eq. 2.

It can be shown by analysis of the variation factor that in order to have less than 1% variation between the frequencies of the realizable oscillator and the theoretical one, the input impedance, $R_I$, must be approximately fifty times greater than $R_2$.

To minimize the variations between the theoretical and actual frequencies, the value of $R_2$ must be made as small as possible and the value of $R_I$ must be made as large as possible. There are, however, limits to how small the value of $R_2$ may be. For instance, the lower the value of $R_2$, the greater its loading effect on the output of the amplifier 10 will be. There are also practical and economical limits on the realizable input impedance of the amplifier 10, especially when using bipolar transistors.

Another way the variation can be minimized is to take into account the input impedance by designing with Equation 2, above. In manufacturing a large number of such amplifiers, however, the input impedance of the amplifiers will vary. The variation of the input impedances will cause variations in the frequencies, the proportional amount of change, i.e., relative error, in variation being $$V = -R_2 r_I/(2R^I + 2R_2) \quad (4)$$

where

V=proportional change in the variation factor $(v), dv/v$; and $r_I$=proportional change in the amplifiers' input impedance, $dRI/RI$.

(The minus sign indicates an inverse relationship, i.e., the frequency variation decreases with an increase in the input impedance.) Again, the proportional change in variation of the frequency can be minimized by making $R_2$ as small as possible and $R_I$ as large as possible. By Equation 4, for example, if $R_I$ is ten times greater than $R_2$ and varies by 10%, the variation in frequency between two oscillators would have a maximum proportional variation of 0.91%. If $R_I$ were equal to $R_2$ with the other conditions given above, the proportional frequency variation would be 5%.

In some applications, such as those requiring compatibility between systems using the oscillators, it is necessary to reduce the frequency variations among oscillators as much as possible.

The present invention reduces the variations among oscillators by using an amplifier with an A-C input impedance that is as low as possible and inserting an impedance, the value of which can be more predictable than that of an amplifier input, especially an amplifier using a bipolar transistor.

Figure 2:
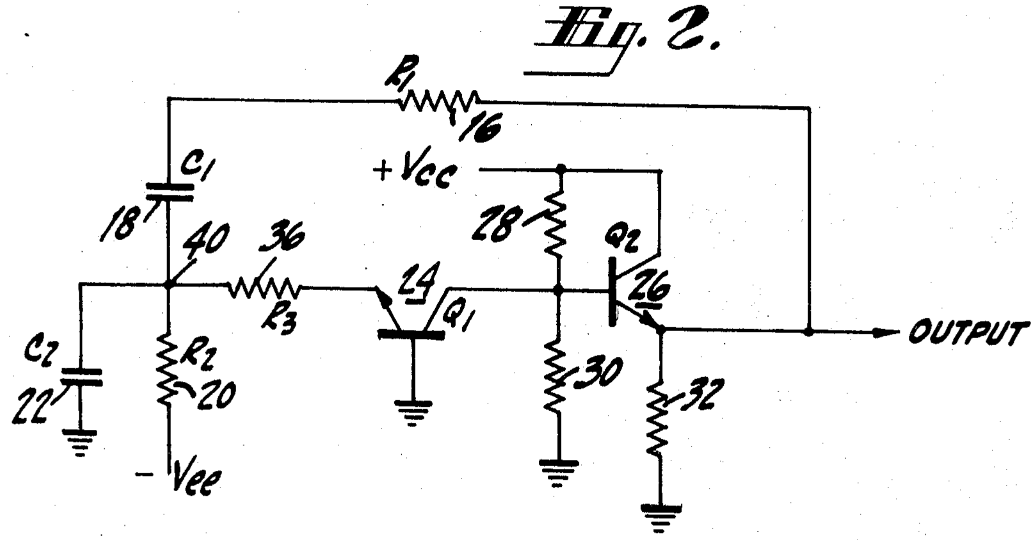
FIG. 2 is a schematic illustrating an embodiment of the present invention.

FIG. 2 is a schematic of an embodiment of the present invention. Two transistors 24 and 26 with the biasing resistors 28, 30 and 32 comprise a non-inverting amplifier having substantially zero A-C input impedance because of the grounded-base configuration of the input stage.

The input impedance of a grounded-base amplifier is approximately equal to $h_{ib}$, a hybrid parameter used in transistor circuit analysis. $h_{ib}$ can be represented as a resistor in series with the input of the transistor's equivalent circuit when used in the common-base configuration. The A-C value of $h_{ib}$ is reduced from the D-C value by the effect of input capacitance so that as the frequency of oscillation increases, the A-C input impedance decreases. For purposes of analysis, the A-C input impedance will be taken as substantially zero. The A-C input impedance of an amplifier used in an oscillator cannot actually be zero, else the A-C input signal would be grounded and there would be no amplification at all. If $R_L$ represents the load impedance of a grounded-base amplifier, then the voltage amplification is approximately equal to $R_L/h_{ib}$. As the value of $h_{ib}$ decreases, the voltage amplification of the stage increases. The difficulty of developing an input signal across a small $h_{ib}$ limits the lowest value $h_{ib}$ that can be permitted. Analytically, as $h_{ib}$ approaches zero, the voltage amplification approaches $R_L/R_S$, where $R_S$ is the impedance of the input signal source and $R_L$, as above, is the load impedance of the amplifier. In FIG. 2, the resistor 36 can be considered the impedance of the signal source $R_S$ and the input impedance of the transistor 26 in parallel with the biasing resistors 28 and 30 can be considered the load impedance $R_L$ of the transistor 24. The voltage gain of the transistor 26 is approximately unity as a result of being used in the common collector configuration (emitter follower) so that the gain required to compensate for the losses in the circuit elements must be supplied by the transistor 24. The losses, or attenuation, in the feedback circuit require a loop gain of $$A = R_1/R_2 + C_2 + C_1 + 1$$

but A was seen to be equal to $R_L/R_S$ so that $$R_L/R_S = R_1/R_2 + C_2/C_1 + 1 \quad (5)$$

The values of $R_1$, $R_2$, $R_L$, and $R_S$ will usually be three to four orders of magnitude greater than the value of $h_{ib}$.

Therefore, the value of $h_{ib}$ may be considered to be substantially zero or negligible.

In a common-emitter or common-collector (emitter follower) configuration, the input impedance of a transistor is approximately equal to $h_{fe}h_{ib}$, where $h_{fe}$ is also a hybrid parameter which is equal to the current gain of the common-emitter stage. Characteristically, the value of $h_{fe}$ may vary more than 100% among transistors of the same type. Furthermore, the value of $h_{fe}$ changes with the life of the transistor. Therefore, the input impedance of a transistor amplifier of other than a grounded-base configuration is too large to have negligible effect on the frequency and varies over too great a range to be predictable when several such oscillators are to be produced.

In FIG. 2, the values of the resistors 20 and 36 can be considered to be connected in parallel in an A-C sense. One terminal of the resistor 20 is returned to the A-C reference point (ground) through the power supply and one terminal of the resistor 36 is connected to the A-C reference point through the transistor 24. The other terminals of the resistors 20 and 36 are connected together at a circuit node 40. The value of the resistors 20 and 36 in parallel will be determined by the design frequency and the amplification required for oscillation.

Using the formulas and relationships given above, it is possible to determine the values of all the circuit elements in the feedback network for any desired frequency. When the oscillator is actually constructed, the variations from the design frequency will be dependent upon the variations in the values of the elements in the feedback network only and independent of the parameters and characteristics of the amplifier. The variations in the values of the elements in the feedback network can be controlled as closely as desired so that when many such oscillators are produced, the variations in their frequency of oscillation will be less than a predetermined value.

Although the embodiment of the invention herein described and illustrated in order to explain the nature of the invention pertains to Wien Bridge oscillators using transistor amplifiers, it will be understood that the invention can be practiced in other types of oscillators and with other amplifying devices using appropriate formulas and relationships that must vary from those given herein as necessary to fit the particular application.

What is claimed is:

1. An oscillator comprising, in combination:

a non-inverting amplifier having first and second input terminals between which there is an alternating current impedance of substantially zero ohms and first and second output terminals, said second output terminal being common with said second input terminal;

a two-terminal impedance means having an alternating current impedance substantially greater than the impedance between said input terminals, connected at one terminal to said first input terminal; and a frequency determining feedback network a first portion of which is connected between said first output terminal and the other terminal of said impedance means and a second portion of which is connected between said other terminal of said impedance means and said common second input terminal.

2. An oscillator as set forth in claim 1 wherein said impedance means comprises a resistor.

3. An oscillator as set forth in claim 1 wherein said portion of the feedback network which is connected between said first output terminal and the other terminal of said impedance means comprises both a resistive component and a reactive component.

4. The combination comprising:

operating power terminal means;

an A-C reference point;

amplifying means with output, input and common terminal means, said amplifying means having substantially zero A-C impedance between the input and the common terminal means;

a circuit node;

first resistor means and first capacitor means connected in series between said output means and said circuit node;

second capacitor means connected between the circuit node and the A-C voltage reference point;

second resistor means connected between said circuit node and said operating power terminal means;

third resistor means connected between the circuit node and the input terminal means; and means connecting said A-C reference point to said common terminal point.

5. The combination as claimed in claim 4 wherein a source of operating voltage is connected to said operating power terminal means.

6. The combination as claimed in claim 4 wherein said amplifying means comprises: a first stage having a first transistor and a second stage having a second transistor.

References Cited

UNITED STATES PATENTS

| | | | |
|---|---|---|---|
| 2,745,960 | 5/1956 | Griffith | 331—110 |
| 3,070,757 | 12/1962 | Plogstedt et al. | 331—110 |

OTHER REFERENCES

Electronics: R. C. Carter, pp. 44–47, Feb. 2, 1962.

JOHN KOMINSKI, Primary Examiner

U.S. Cl. X.R.

331—141

UNITED STATES PATENT OFFICE

CERTIFICATE OF CORRECTION

Patent No. 3,562,669 Dated February 9, 1971

Inventor(s) David W. Hall II

It is certified that error appears in the above-identified patent and that said Letters Patent are hereby corrected as shown below:

Col. 2, Equation (2), after "$^{-1/2}$" and before "(2π)" inser a slash --- / ---.
Col. 3, Equation (4), "$2R^{I}$" should be --- $2R_{I}$ ---.
Col. 3, Equation on line 69, the second plus sign (+) shou be a slash --- / ---

Signed and sealed this 7th day of March 1972.

(SEAL)
Attest:

EDWARD M.FLETCHER,JR.
Attesting Officer

ROBERT GOTTSCHALK
Commissioner of Patents